(12) United States Patent
Kim

(10) Patent No.: US 8,945,974 B2
(45) Date of Patent: Feb. 3, 2015

(54) METHOD OF MANUFACTURING ORGANIC LIGHT-EMITTING DISPLAY DEVICE USING AN ORGANIC LAYER DEPOSITION APPARATUS

(71) Applicant: Samsung Display Co., Ltd., Yongin, Gyeonggi-Do (KR)

(72) Inventor: Sung-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 13/725,610

(22) Filed: Dec. 21, 2012

(65) Prior Publication Data

US 2014/0077168 A1    Mar. 20, 2014

(30) Foreign Application Priority Data

Sep. 20, 2012    (KR) .......................... 10-2012-0104622

(51) Int. Cl.
| | |
|---|---|
| *H01L 21/00* | (2006.01) |
| *H01L 51/50* | (2006.01) |
| *H01L 33/08* | (2010.01) |
| *C23C 14/04* | (2006.01) |
| *C23C 14/24* | (2006.01) |

(Continued)

(52) U.S. Cl.
CPC ................ *H01L 51/50* (2013.01); *H01L 33/08* (2013.01); *C23C 14/042* (2013.01); *C23C 14/243* (2013.01); *C23C 14/50* (2013.01); *C23C 14/56* (2013.01)
USPC .................................. 438/82; 438/99; 257/40

(58) Field of Classification Search
CPC ...... H01L 33/08; H01L 51/5012; H01L 51/56; H01L 51/50; H01L 51/0072
USPC .......................................... 438/82, 99; 257/40
See application file for complete search history.

(56) References Cited

U.S. PATENT DOCUMENTS

| | | | |
|---|---|---|---|
| 4,468,648 | A | 8/1984 | Uchikune |
| 5,487,609 | A | 1/1996 | Asada |

(Continued)

FOREIGN PATENT DOCUMENTS

| | | |
|---|---|---|
| CN | 1704501 A | 12/2005 |
| CN | 1841696 A | 10/2006 |

(Continued)

OTHER PUBLICATIONS

Chinese Office Action dated Oct. 9, 2012, for corresponding Chinese Patent Application No. 2010-10266406.6, 6 pages.

(Continued)

*Primary Examiner* — Andy Huynh
(74) *Attorney, Agent, or Firm* — Christie, Parker & Hale, LLP

(57) ABSTRACT

A method of manufacturing an organic light-emitting display device includes: fixing a substrate onto an electrostatic chuck; combining the electrostatic chuck with a chuck moving member; moving the electrostatic chuck along a guide member into a chamber by using the chuck moving member; and depositing an organic layer on the substrate while moving the substrate with respect to an organic layer deposition assembly arranged in the chamber, the chuck moving member being moved along the guide member by an association of a chain unit and a hook unit, and the substrate being spaced apart from the organic layer deposition assembly.

9 Claims, 13 Drawing Sheets

(51) Int. Cl.
  *C23C 14/50* (2006.01)
  *C23C 14/56* (2006.01)

(56) References Cited

U.S. PATENT DOCUMENTS

| | | |
|---|---|---|
| 5,909,995 A | 6/1999 | Wolf et al. |
| 6,274,198 B1 | 8/2001 | Dautartas |
| 6,371,451 B1 | 4/2002 | Choi |
| 6,483,690 B1 | 11/2002 | Nakajima et al. |
| 6,749,906 B2 | 6/2004 | Van Slyke |
| 6,995,035 B2 | 2/2006 | Cok et al. |
| 7,964,037 B2 | 6/2011 | Fukuda et al. |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2002/0194727 A1 | 12/2002 | Cho et al. |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0263074 A1 | 12/2005 | Masuda et al. |
| 2006/0102078 A1 | 5/2006 | Fairbairn et al. |
| 2006/0144325 A1 | 7/2006 | Jung et al. |
| 2006/0164786 A1 | 7/2006 | Kobayashi et al. |
| 2006/0174829 A1 | 8/2006 | An et al. |
| 2006/0205101 A1 | 9/2006 | Lee et al. |
| 2006/0255722 A1 | 11/2006 | Imanishi |
| 2006/0278522 A1 | 12/2006 | Kim et al. |
| 2007/0009652 A1 | 1/2007 | Manz et al. |
| 2007/0046913 A1 | 3/2007 | Shibazaki |
| 2007/0077358 A1 | 4/2007 | Jeong et al. |
| 2007/0178708 A1 | 8/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0298947 A1 | 12/2008 | Yeo et al. |
| 2009/0017192 A1 | 1/2009 | Matsuura |
| 2009/0153033 A1 | 6/2009 | Lee et al. |
| 2009/0229524 A1 | 9/2009 | Kim et al. |
| 2009/0232976 A1 | 9/2009 | Yoon et al. |
| 2010/0130020 A1 | 5/2010 | Kim et al. |
| 2010/0156279 A1 | 6/2010 | Tamura et al. |
| 2011/0241438 A1 | 10/2011 | Kim et al. |
| 2012/0097992 A1* | 4/2012 | Jeong ............................... 257/88 |
| 2012/0100644 A1* | 4/2012 | Prushinskiy et al. ............ 438/22 |
| 2012/0103253 A1* | 5/2012 | Park et al. ....................... 118/301 |
| 2012/0145077 A1* | 6/2012 | Chang et al. .................... 118/712 |
| 2012/0299016 A1* | 11/2012 | Choi ................................. 257/79 |
| 2012/0299023 A1* | 11/2012 | Lee et al. .......................... 257/88 |
| 2012/0301614 A1* | 11/2012 | Choi et al. ................... 427/255.5 |
| 2012/0301986 A1* | 11/2012 | Choi et al. ....................... 438/34 |
| 2013/0008379 A1* | 1/2013 | Chang et al. .................... 118/712 |
| 2013/0009177 A1* | 1/2013 | Chang et al. ..................... 257/88 |
| 2013/0157016 A1* | 6/2013 | Kim ................................ 428/172 |

FOREIGN PATENT DOCUMENTS

| | | |
|---|---|---|
| EP | 1 413 644 A2 | 4/2004 |
| EP | 1 418 250 A2 | 5/2004 |
| EP | 1 518 940 A1 | 3/2005 |
| JP | 04-272170 | 9/1992 |
| JP | 1993-022405 U | 3/1993 |
| JP | 10-120171 | 5/1998 |
| JP | 2000-068054 | 3/2000 |
| JP | 2001-028325 | 1/2001 |
| JP | 2001-028325 A | 1/2001 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2003-347394 A | 12/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2004-342455 A | 12/2004 |
| JP | 2005-044592 A | 2/2005 |
| JP | 2005-213616 A | 8/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2006-307247 A | 11/2006 |
| JP | 2007-047293 A | 2/2007 |
| JP | 2008-019477 A | 1/2008 |
| JP | 2008-121098 A | 5/2008 |
| JP | 2009-019243 A | 1/2009 |
| JP | 2009-87910 A | 4/2009 |
| JP | 2009-117231 A | 5/2009 |
| JP | 2010-159167 A | 7/2010 |
| KR | 10-1997-0008709 A | 3/1997 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0088662 A | 11/2002 |
| KR | 10-2002-0090934 A | 12/2002 |
| KR | 10-2003-0043012 A | 6/2003 |
| KR | 10-0405080 B1 | 11/2003 |
| KR | 10-0406059 A | 11/2003 |
| KR | 10-2003-0091947 A | 12/2003 |
| KR | 10-2003-0093959 A | 12/2003 |
| KR | 10-2004-0034537 A | 4/2004 |
| KR | 10-0430336 A1 | 5/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0024324 A | 3/2005 |
| KR | 10-0520159 B1 | 10/2005 |
| KR | 10-2006-0008602 A | 1/2006 |
| KR | 10-2006-0018745 A | 3/2006 |
| KR | 10-2006-0073367 | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0741142 B1 | 7/2007 |
| KR | 10-2007-0078713 A | 8/2007 |

(56) References Cited

FOREIGN PATENT DOCUMENTS

| | | | |
|---|---|---|---|
| KR | 10-2007-0080635 A | 8/2007 | |
| KR | 10-2007-0091437 A | 9/2007 | |
| KR | 10-2007-0101842 A | 10/2007 | |
| KR | 10-2007-0105595 A | 10/2007 | |
| KR | 10-0770653 B1 | 10/2007 | |
| KR | 10-2008-0001184 A | 1/2008 | |
| KR | 10-2008-0007896 A | 1/2008 | |
| KR | 10-2008-0009285 A | 1/2008 | |
| KR | 10-0797787 B1 | 1/2008 | |
| KR | 10-0800125 B1 | 1/2008 | |
| KR | 10-0823508 B1 | 4/2008 | |
| KR | 10-2008-0044239 A | 5/2008 | |
| KR | 10-2008-0046761 A | 5/2008 | |
| KR | 10-0827760 B1 | 5/2008 | |
| KR | 10-2008-0057159 A | 6/2008 | |
| KR | 10-0839380 B1 | 6/2008 | |
| KR | 10-2008-0060400 A | 7/2008 | |
| KR | 10-2008-0061132 A | 7/2008 | |
| KR | 10-2008-0062212 A | 7/2008 | |
| KR | 10-2008-0076574 A | 8/2008 | |
| KR | 10-2008-0104479 A | 12/2008 | |
| KR | 10-2008-0104695 A | 12/2008 | |
| KR | 10-2009-0038733 A | 4/2009 | |
| KR | 10-0899279 B1 | 5/2009 | |
| KR | 10-2009-0066996 A | 6/2009 | |
| KR | 10-2009-0075887 A | 7/2009 | |
| KR | 10-2009-0079765 A | 7/2009 | |
| KR | 10-2009-0081717 A | 7/2009 | |
| KR | 10-2009-0094911 A | 9/2009 | |
| KR | 10-2009-0097453 A | 9/2009 | |
| KR | 10-2010-0038088 A | 4/2010 | |
| KR | 10-2010-0044606 A | 4/2010 | |
| KR | 10-2010-0128589 A | 12/2010 | |
| KR | 10-1017654 B1 | 2/2011 | |
| KR | 10-2011-0110525 A | 10/2011 | |
| WO | WO 03/043067 A1 | 5/2003 | |
| WO | WO 2004/016406 A1 | 2/2004 | |

OTHER PUBLICATIONS

English Abstract, Publication No. 1020080002189, dated Jan. 4, 2008, for corresponding Korean Patent 10-0800125.
European Search Report dated May 27, 2011, for corresponding European Patent application 10251514.5, 11 pages.
KIPO Notice of Allowance dated Apr. 26, 2012, for Korean Patent application 10-2010-0066991, (5 pages).
KIPO Office action dated Apr. 9, 2012, for Korean priority Patent application 10-2010-0031556, (4 pages).
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
Korean Patent Abstracts, Publication No. 10-0151312 B1, dated Jun. 18, 1998, corresponding to Korean Publication 1997-0008709.
Korean Patent Abstracts, Publication No. 1020010062735, dated Jul. 7, 2001, for corresponding Korean Patent 10-0827760.
Korean Patent Abstracts, Publication No. 1020020034272, dated May 9, 2002, for corresponding Korean Patent 10-0726132.
Korean Patent Abstracts, Publication No. 1020020056238, dated Jul. 10, 2002, for corresponding Korean Patent 10-0698033.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020040062203, dated Jul. 7, 2002, for corresponding Korean Patent 10-0646160.
Korean Patent Abstracts, Publication No. 1020050045619, dated May 17, 2005, for corresponding Korean Patent 10-0520159.
Korean Patent Abstracts, Publication No. 1020050078637, dated Aug. 5, 2005, for corresponding Korean Patent 10-0700466.
Korean Patent Abstracts, Publication No. 1020060101987, dated Sep. 27, 2006, for corresponding Korean Patent 10-0687007.
Korean Patent Abstracts, Publication No. 1020060126267, dated Dec. 6, 2006, for corresponding Korean Patent 10-0797787.
Korean Patent Abstracts, Publication No. 1020070025164, dated Mar. 8, 2007, for corresponding Korean Patent 10-0711885.
Korean Patent Abstracts, Publication No. 10-2007-0056241, dated Jun. 4, 2007, corresponding to Korean Patent 10-0741142 B1.
Korean Patent Abstracts, Publication No. 1020080038650, dated May 7, 2008, for corresponding Korean Patent 10-0839380.
Korean Patent Abstracts, Publication No. 10-2008-0070302, dated Jul. 30, 2008, corresponding to Korean Patent 10-0899279 B1.
Patent Abstracts of Japan, and English machine translation of Japanese Publication 2001-052862, 20 pages.
Patent Abstracts of Japan, and English machine translation of Japanese Publication 2003-003250, 25 pages.

* cited by examiner

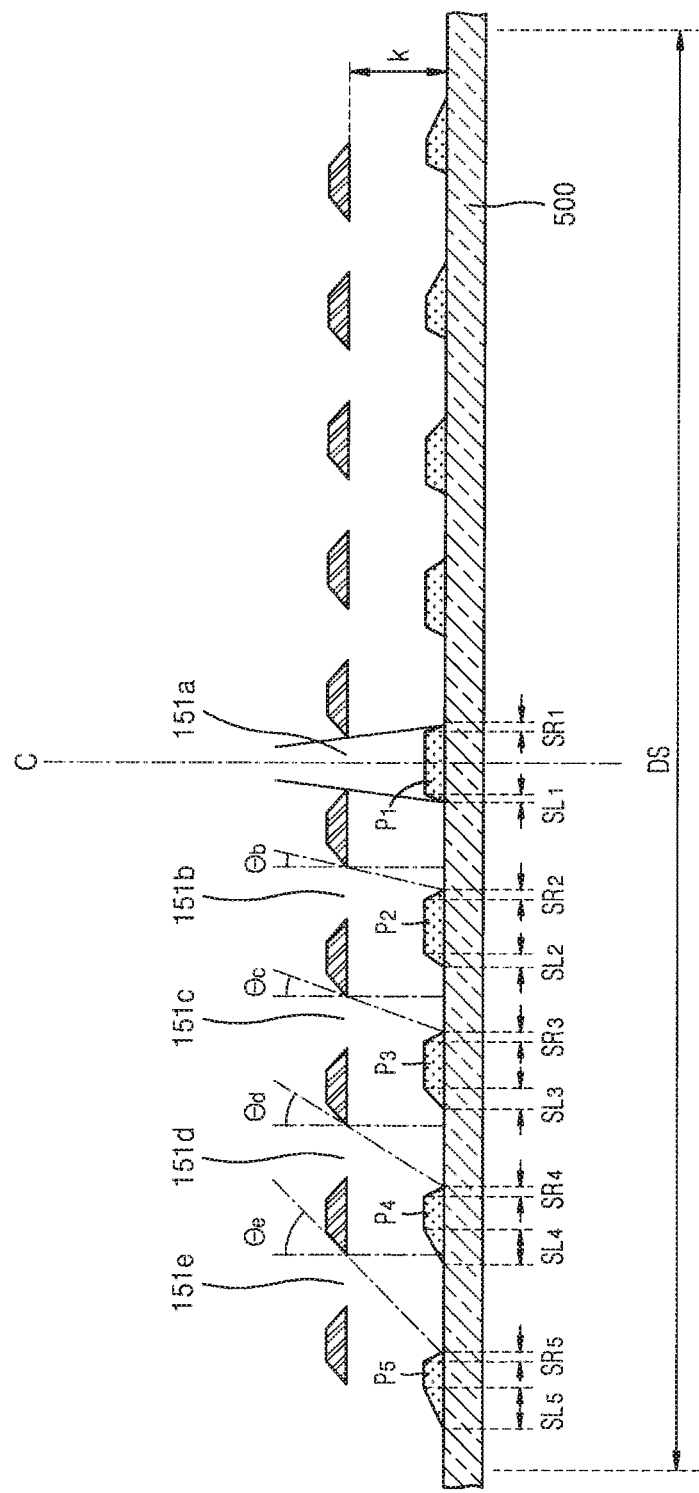

METHOD OF MANUFACTURING ORGANIC LIGHT-EMITTING DISPLAY DEVICE USING AN ORGANIC LAYER DEPOSITION APPARATUS

CROSS-REFERENCE TO RELATED APPLICATION

This application claims priority to and the benefit of Korean Patent Application No. 10-2012-0104622, filed on Sep. 20, 2012 in the Korean Intellectual Property Office, the entire content of which is incorporated herein by reference.

BACKGROUND

1. Field

Aspects of embodiments of the present invention relate to an organic layer deposition apparatus, a method of manufacturing an organic light-emitting display device using the same, and an organic light-emitting display device.

2. Description of the Related Art

Organic light-emitting display devices have wider viewing angles, better contrast characteristics, and faster response speeds than other display devices, and thus have drawn attention as next-generation display devices.

In general, an organic light-emitting display device has a stacked structure including an anode, a cathode, and an emission layer interposed between the anode and the cathode. The apparatus displays images in color when holes and electrons, injected respectively from the anode and the cathode, recombine in the emission layer and thus light is emitted. However, it is difficult to achieve a high light-emission efficiency with such a structure. Thus, intermediate layers, including an electron injection layer, an electron transport layer, a hole transport layer, a hole injection layer, etc., are optionally additionally interposed between the emission layer and each of the electrodes.

SUMMARY

According to an aspect of embodiments of the present invention, an organic layer deposition apparatus is easily manufactured, is suitable for use in the mass production of a large substrate, improves a manufacturing yield and a deposition efficiency, and has an improved precision of transferring a substrate. According to further aspects of embodiments of the present invention, a method of manufacturing an organic light-emitting display device using the above-described organic layer deposition apparatus, and an organic light-emitting display device manufacturing using the organic layer deposition apparatus are provided.

According to an embodiment of the present invention, an organic layer deposition apparatus includes: a deposition source configured to discharge a deposition material; a deposition source nozzle unit arranged at a side of the deposition source and including a plurality of deposition source nozzles; a patterning slit sheet facing the deposition source nozzle unit and having a plurality of patterning slits; an electrostatic chuck configured to chuck a substrate; a chuck moving member combined with and configured to transport the electrostatic chuck; and a guide member configured to guide a moving direction of the chuck moving member, and the chuck moving member includes a hook unit having a variable height, and the guide member includes a chain unit corresponding to the hook unit, the hook unit is insertable into the chain unit, and the chuck moving member is moveable along the guide member as the chain unit operates, and the substrate is spaced apart from the patterning slit sheet by a distance and is moveable with respect to the organic layer deposition apparatus.

The chain unit may include a sprocket rotatably arranged on the guide member; and a timing chain configured to surround an external surface of the sprocket.

The sprocket may include a first sprocket arranged at an end of the timing chain; and a second sprocket arranged at another end of the timing chain.

The chain unit may further include a tension maintaining unit arranged within the timing chain and configured to maintain a tension of the timing chain.

The timing chain may be arranged in a lengthwise direction of the guide member.

The chain unit may further include a driving unit connected to and configured to rotate the sprocket.

The apparatus may further include a chamber in which the deposition source, the deposition source nozzle unit, the patterning slit sheet, the electrostatic chuck, the chuck moving member, and the guide member are arranged, and the driving unit may be outside the chamber and connected to the sprocket via a shaft.

The hook unit may include a hook housing on the chuck moving member; a hook combined with the hook housing to allow the hook housing to be linearly moved; and an elastic part combined with the hook housing and the hook.

The hook may be contactable with the chain unit to be linearly moved in a height direction of the hook housing.

The apparatus may further include a linear motion (LM) guide between the chuck moving member and the guide member.

The LM guide may include guide blocks on the chuck moving member; and guide rails on the guide member, and the guide blocks may be movable along the guide rails.

The apparatus may further include a loading unit configured to fix the substrate to the electrostatic chuck; and an unloading unit configured to separate the substrate from the electrostatic chuck after the substrate is deposited with the deposition material.

The hook unit and the chain unit may be configured to move the electrostatic chuck and the chuck moving member sequentially to the loading unit, a deposition unit, and the unloading unit, the deposition unit including the deposition source and the deposition source nozzle unit.

The deposition material discharged from the deposition source may pass through the patterning slit sheet and may be deposited on the substrate in a pattern.

The patterning slit sheet of the organic layer deposition apparatus may be smaller than the substrate in at least one of a first direction or a second direction perpendicular to the first direction.

The deposition source nozzles may be arranged along a first direction, and the patterning slits may be arranged along a second direction perpendicular to the first direction.

According to another embodiment of the present invention, an organic light-emitting display device manufactured using an organic layer deposition apparatus according to an embodiment of the present invention includes the substrate being larger than the patterning slit sheet in at least one of a first direction or a second direction perpendicular to the first direction; and at least one organic layer formed on the substrate by the organic layer deposition apparatus, and the at least one organic layer has a linear pattern.

The at least one organic layer may include an emission layer.

The at least one organic layer may include at least one selected from the group consisting of a hole injection layer, a hole transport layer, an electron transport layer, and an electron injection layer.

The at least one organic layer may have a non-uniform thickness.

According to another embodiment of the present invention, an organic light-emitting display device includes at least one organic layer formed using an organic layer deposition apparatus according to an embodiment of the present invention, and having a non-uniform thickness.

According to another embodiment of the present invention, a method of manufacturing an organic light-emitting display device includes: fixing a substrate to an electrostatic chuck; combining the electrostatic chuck with a chuck moving member; moving the electrostatic chuck along a guide member into a chamber by using the chuck moving member; and depositing an organic layer on the substrate while moving the substrate with respect to an organic layer deposition assembly arranged in the chamber, and the chuck moving member is moved along the guide member by an association of a chain unit and a hook unit, and the substrate is spaced apart from the organic layer deposition assembly.

The chuck moving member may include the hook unit having a variable height, and the guide member may include the chain unit corresponding to the hook unit.

The chain unit may include a sprocket rotatably arranged on the guide member; and a timing chain configured to surround an external surface of the sprocket.

The timing chain may be arranged in a lengthwise direction of the guide member.

The chain unit may further include a driving unit connected to and configured to rotate the sprocket.

The organic layer deposition assembly, the electrostatic chuck, the chuck moving member, and the guide member may be arranged in the chamber, and the driving unit may be outside the chamber and connected to the sprocket via a shaft.

The hook unit may include a hook housing on the chuck moving member; a hook combined with the hook housing to allow the hook housing to be linearly moved; and an elastic part combined with the hook housing and the hook.

The hook may be contactable with the chain unit to be linearly moved in a height direction of the hook housing.

The moving of the electrostatic chuck may include generating a driving force to rotate a shaft by using a driving unit; rotating a timing chain as a sprocket rotates due to the rotation of the shaft; and inserting a hook into the timing chain due to the rotation of the timing chain to move the chuck moving member along the guide member.

BRIEF DESCRIPTION OF THE DRAWINGS

The above and other features and aspects of the present invention will become more apparent by describing in detail some exemplary embodiments thereof with reference to the attached drawings, in which:

FIG. 15 is a schematic cross-sectional view illustrating organic layers formed on the substrate by using the patterning slit sheet of FIG. 14, according to an embodiment of the present invention.

DETAILED DESCRIPTION

Hereinafter, some exemplary embodiments of the present invention are described in further detail with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
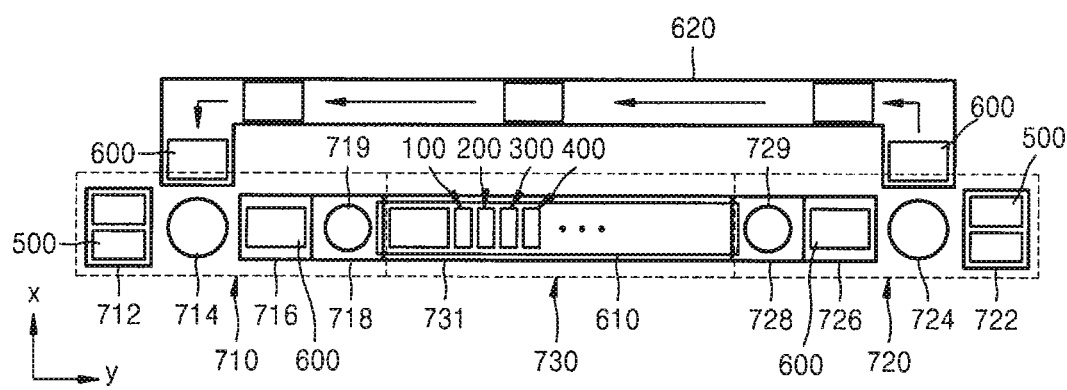
FIG. 1 is a schematic view of an organic layer deposition apparatus according to an embodiment of the present invention.

FIG. 1 is a schematic view of an organic layer deposition apparatus according to an embodiment of the present invention.

Referring to FIG. 1, the organic layer deposition apparatus according to one embodiment includes a loading unit 710, a deposition unit 730, an unloading unit 720, a first conveyer unit 610, and a second conveyer unit 620.

The loading unit 710, in one embodiment, may include a first rack 712, a transport robot 714, a transport chamber 716, and a first inversion chamber 718.

A plurality of substrates 500 onto which a deposition material is not applied are stacked on the first rack 712. The transport robot 714 picks up one of the substrates 500 from the first rack 712, disposes it on an electrostatic chuck 600 transported by the second conveyer unit 620, and moves the electrostatic chuck 600 having the substrate 500 thereon into the transport chamber 716.

The first inversion chamber 718 is disposed adjacent to the transport chamber 716. A first inversion robot 719 disposed in the first inversion chamber 718 inverts the electrostatic chuck 600 and then loads it onto the first conveyer unit 610 of the deposition unit 730.

Figure 2:
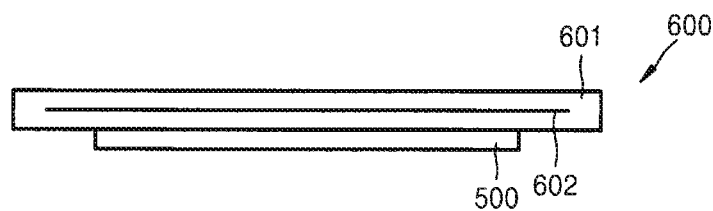
FIG. 2 is a schematic cross-sectional view of an electrostatic chuck of an organic layer deposition apparatus, according to an embodiment of the present invention, and a substrate arranged on the electrostatic chuck.

As illustrated in FIG. 2, the electrostatic chuck 600, in one embodiment, may include an electrode 602 embedded in a main body 601 formed of ceramic, such that the electrode 602 may be supplied with power. The substrate 500 is attached to a surface of the main body 601 when a high voltage is applied to the electrode 602.

In FIG. 1, the transport robot 714 places one of the substrates 500 on an upper surface of the electrostatic chuck 600, and the electrostatic chuck 600 on which the substrate 500 is disposed is loaded into the transport chamber 716. The first inversion robot 719 inverts the electrostatic chuck 600 such that the substrate 500 is turned upside down in the deposition unit 730.

The unloading unit 720 may be configured to operate in an opposite manner to the loading unit 710 described above. In one embodiment, a second inversion robot 729 in a second inversion chamber 728 inverts the electrostatic chuck 600 having the substrate 500 thereon, which has passed through the deposition unit 730, and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 onto a second rack 722. The electrostatic chuck 600 separated from the substrate 500 is returned to the loading unit 710 via the second conveyer unit 620.

The first conveyer unit 610 and the second conveyer unit 620 may be variously placed. For example, the first conveyer unit 610 and the second conveyer unit 620 may be placed on the same plane. Alternatively, the first conveyer unit 610 and the second conveyer unit 620 may be placed on different planes. Hereinafter, for convenience of explanation, it is described that the first conveyer unit 610 and the second conveyer unit 620 are placed on the same plane.

Embodiments of the present invention, however, are not limited to the above description. For example, when the substrate 500 is initially disposed on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 may not be present.

The deposition unit 730 may include at least one deposition chamber. In the embodiment shown in FIG. 1, the deposition unit 730 includes a first chamber 731, in which first to fourth organic layer deposition assemblies 100, 200, 300, and 400 are disposed. However, although FIG. 1 illustrates that a total of four organic layer deposition assemblies, i.e. the first to fourth organic layer deposition assemblies 100, 200, 300, and 400, are arranged in the first chamber 731, the total number of organic layer deposition assemblies that may be installed in the first chamber 731 may vary according to one or more deposition materials and deposition conditions. The first chamber 731, in one embodiment, is maintained in a vacuum state during a deposition process.

In one embodiment, the electrostatic chuck 600 having the substrate 500 thereon may be moved at least to the deposition unit 730 or may be moved sequentially to the loading unit 710, the deposition unit 730, and the unloading unit 720 by the first conveyor unit 610. When the substrate 500 is separated from the electrostatic chuck 600 by the unloading unit 720, then the electrostatic chuck 600 is moved back to the loading unit 710 by the second conveyor unit 620.

Figure 3:
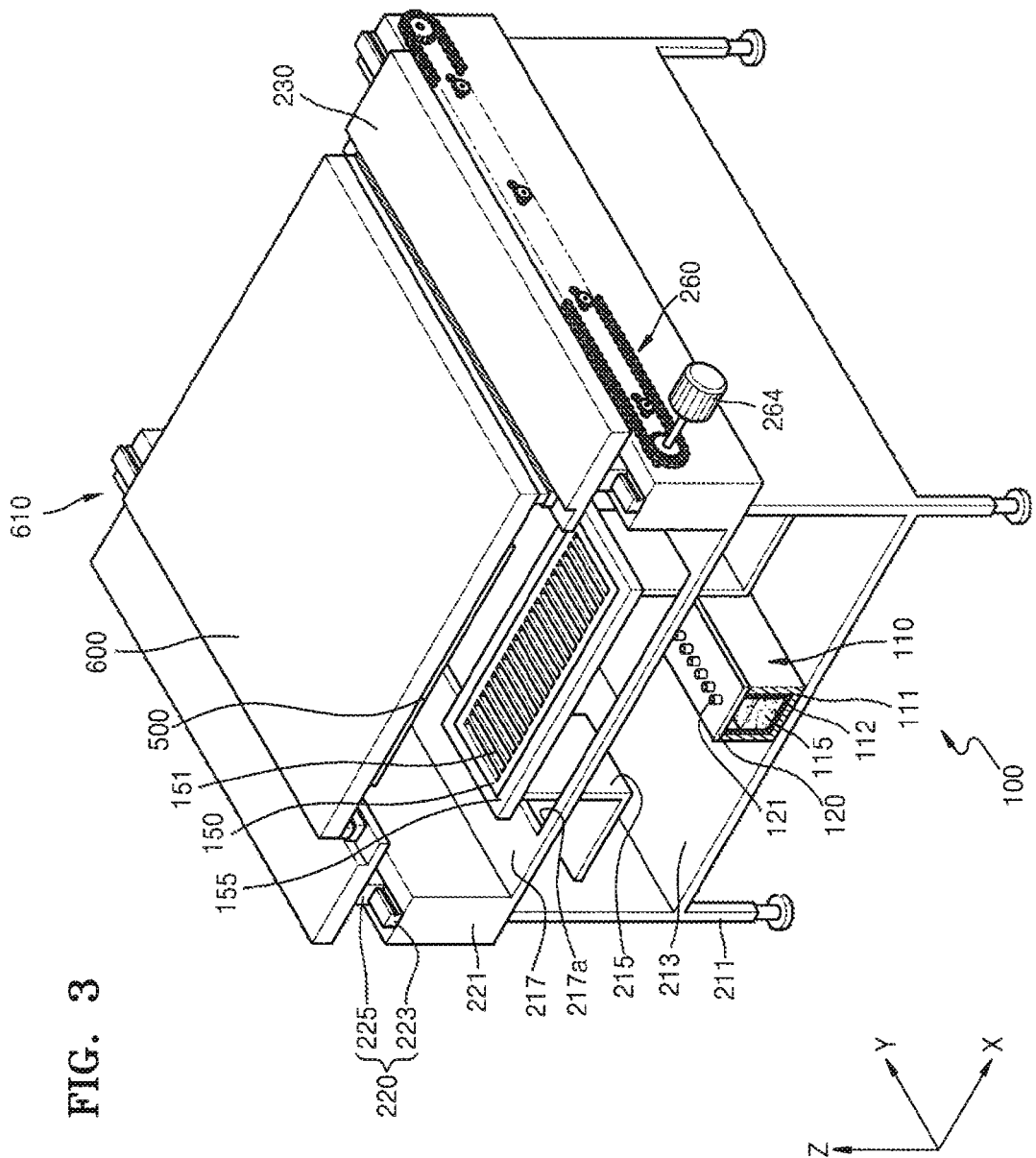
FIG. 3 is a perspective view of a first conveyor unit and a first organic layer deposition assembly of the organic layer deposition apparatus of FIG. 1, according to an embodiment of the present invention.
Figure 4:
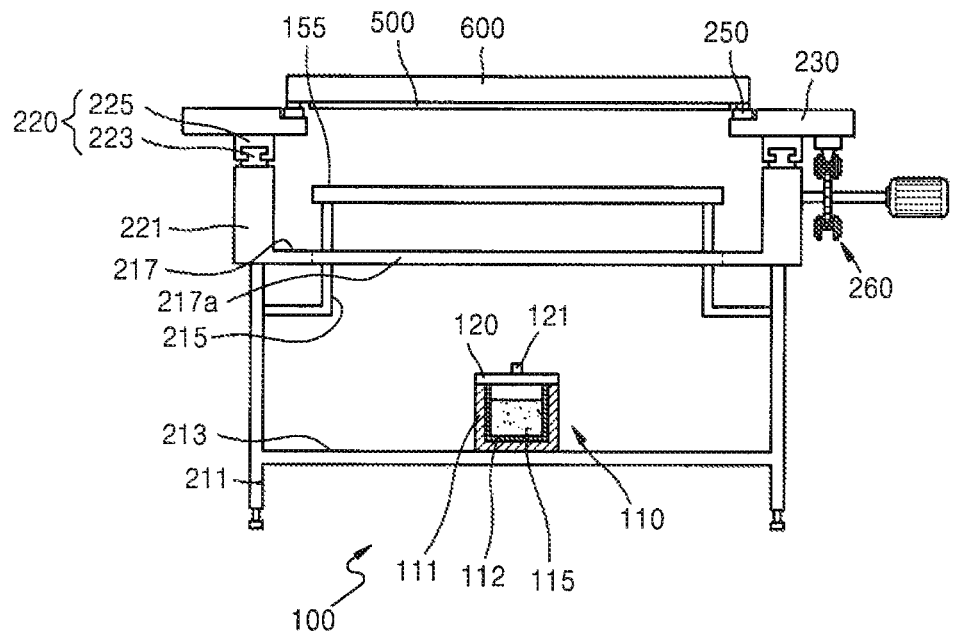
FIG. 4 is a front view of the first conveyor unit and the first organic layer deposition assembly of FIG. 3, according to an embodiment of the present invention.

FIG. 3 is a perspective view of the first conveyor unit 610 and the first organic layer deposition assembly 100 of the organic layer deposition apparatus of FIG. 1, according to an embodiment of the present invention. FIG. 4 is a front view of the first conveyor unit 610 and the first organic layer deposition assembly 100 of FIG. 3. For convenience of explanation, the first chamber 731 is not shown in FIG. 3.

Figure 5:
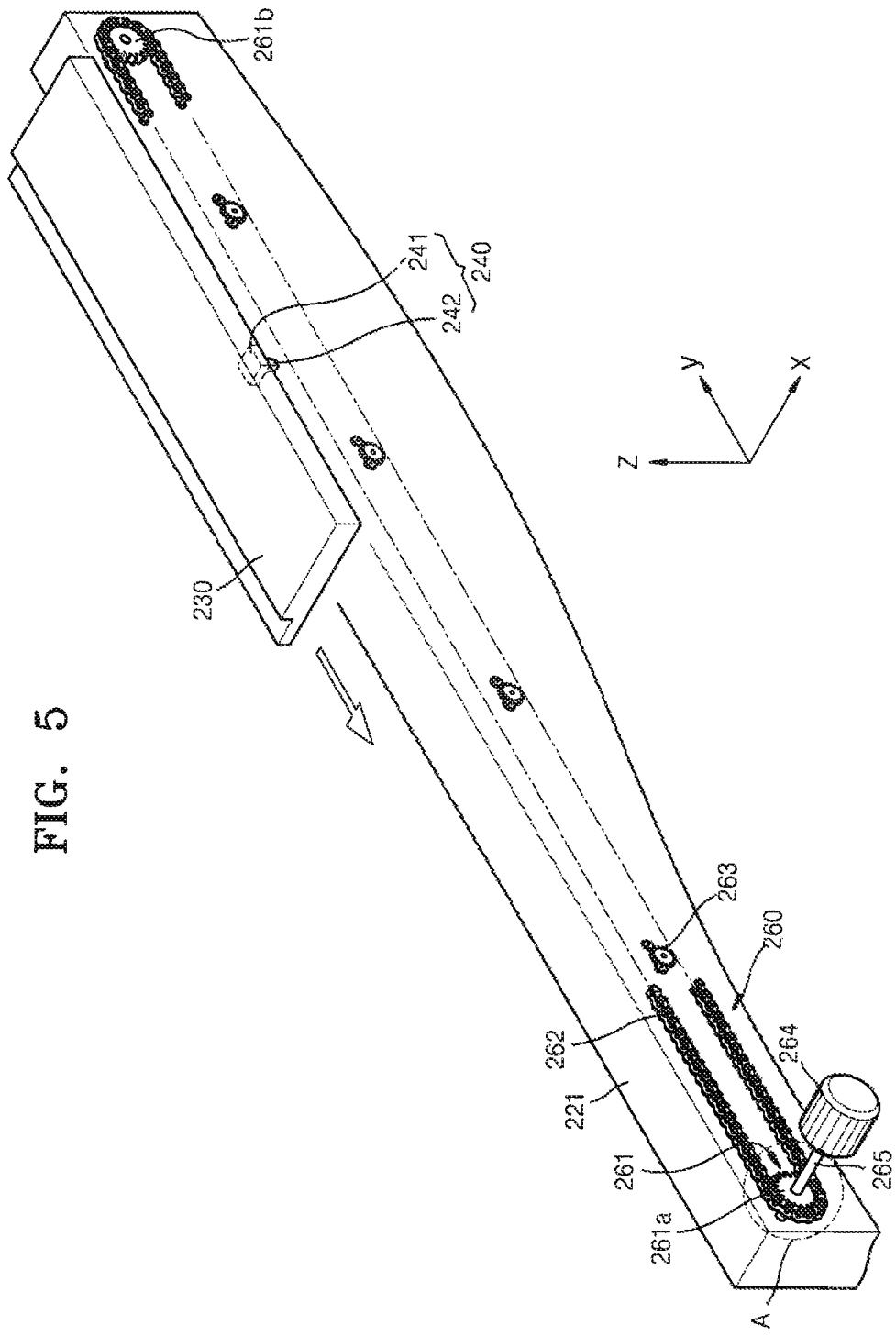
FIG. 5 is a perspective view of a chuck transfer member and a guide member of the organic layer deposition apparatus of FIG. 1, according to an embodiment of the present invention.

Referring to FIGS. 3 to 5, the organic layer deposition apparatus includes the first conveyor unit 610 and the organic layer deposition assembly 100.

In one embodiment, the organic layer deposition assembly 100 includes a deposition source 110, a deposition source nozzle unit 120, and a patterning slit sheet 150. The deposition source 110, in one embodiment, includes a crucible 111 filled with a deposition material 115, and a heater 112 that heats the crucible 111 to vaporize the deposition material 115 which is contained in the crucible 111 toward the deposition source nozzle unit 120. The deposition source nozzle unit 120 is disposed at a side of the deposition source 110. The deposition source nozzle unit 120, in one embodiment, includes a plurality of deposition source nozzles 121 arranged in a direction (e.g., the Y-axis direction). In one embodiment, the patterning slit sheet 150 and a frame 155 are further disposed between the deposition source 110 and the substrate 500. The patterning slit sheet 150 includes a plurality of patterning slits 151 arranged in a direction (e.g., the X-axis direction). In one embodiment, the deposition source 110, the deposition source nozzle unit 120, and the patterning slit sheet 150 may be formed as separate units in the deposition unit 730. This will be described below in more detail.

The first conveyor unit 610 will now be described in further detail.

The first conveyor unit 610 moves the electrostatic chuck 600 fixing the substrate 500 by using a chuck transfer member 230. The first conveyor unit 610, in one embodiment, includes a frame 211, a sheet support unit 215, a guide member 221, a chain unit 260, a linear motion (LM) guide 220, and the chuck transfer member 230. The frame 211 may include a lower plate 213 and an upper plate 217, and the sheet support unit 215 may be formed inside the frame 211. The guide member 221 is formed on the frame 211. The chain unit 260 is located at a side of the guide member 221. The LM guide 220 is disposed between the guide member 221 and the chuck transfer member 230. The chuck transfer member 230 is combined with the electrostatic chuck 600, and includes a hook unit 240 (see FIG. 5) located to correspond to the chain unit 260 and having a variable height. In one embodiment, the electrostatic chuck 600 and the chuck transfer member 230 may be combined with or separated from one another via clamps 250. This will be described in further detail below.

The frame 211 is used as a base of the first conveyor unit 610 and may be formed in a hollow box shape. The lower plate 213 forms a lower surface of the frame 211, and the deposition source 110 may be disposed on the lower plate 213. The upper plate 617 forms an upper surface of the frame 211 and may have an aperture 217a through which the deposition material 115 vaporized in the deposition source 110 may pass through the patterning slit sheet 150 and then be deposited on the substrate 500. These components of the frame 211 may be individually manufactured and then combined with one another, or may be manufactured integrally.

Although not shown, the lower plate 213 on which the deposition source 110 is disposed may be formed in a cassette shape, such that the lower plate 213 may be detached from the frame 211. Thus, the deposition source 110 may be easily exchanged with another deposition source.

The sheet support unit 215 may protrude from an inner side surface of the frame 211 and support the patterning slit sheet 150. The sheet support unit 215 may guide a transferring path of the deposition material 115 discharged through the deposition source nozzles 121, so as to prevent or substantially prevent the deposition material 115 from flowing in a wrong direction. Although not shown, according to another embodiment of the present invention, the sheet support unit 215 may protrude from inner side surfaces of the guide member 221 and support the patterning slit sheet 150.

The guide member 221 is formed on the upper plate 217. The guide member 221 is installed to pass through the first chamber 731 of the deposition unit 730. The guide member 221, in one embodiment, is formed as a pair extending in a direction (e.g., the Y-axis direction) and being symmetrical in a direction (e.g., the Y-axis direction). The guide member 221 provides a transferring path of the chuck transfer member 230.

An upper surface of the guide member 221 is substantially planar, and the chuck transfer member 230 is disposed on the guide member 221. The LM guide 220 may be disposed between the guide member 221 and the chuck transfer member 230. This will be described further below.

Figure 6:
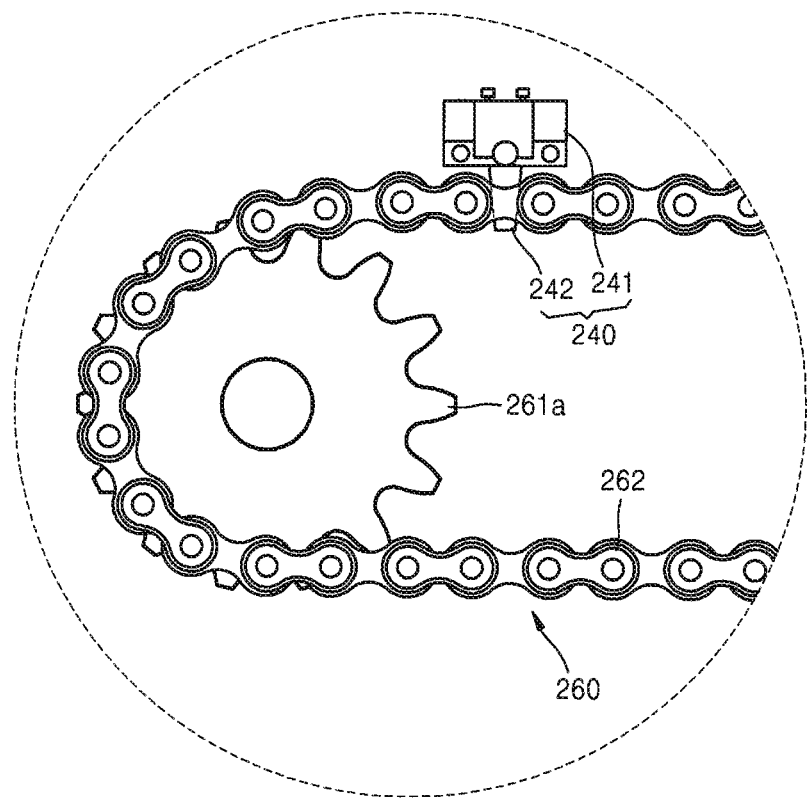
FIG. 6 is an enlarged side view of a region "A" of FIG. 5.
Figure 7:
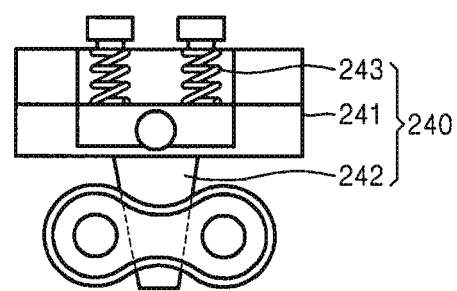
FIG. 7 is a schematic view showing operation of a hook unit of FIG. 6, according to an embodiment of the present invention.

FIG. 5 is a perspective view of the chuck transfer member 230 and the guide member 221 of the organic layer deposition apparatus of FIG. 1, according to an embodiment of the present invention. FIG. 6 is an enlarged side view of a region "A" of FIG. 5. FIG. 7 is a schematic view showing operation of the hook unit 240 of FIG. 6, according to an embodiment of the present invention.

Referring to FIGS. 5 to 7, the chain unit 260, in one embodiment, may be disposed on an external side surface of the guide member 221, and the hook unit 240 may be disposed on the chuck transfer member 230 to correspond to the chain unit 260. In one embodiment, the hook unit 240 is partially inserted into the chain unit 260, and the chuck transfer member 230 is moved along the guide member 221 due to operation of the chain unit 260.

In one embodiment, the chain unit 260 includes a sprocket 261 that is rotatably formed on the guide member 221. Also, the chain unit 260 may include a timing chain 262 formed to surround an external surface of the sprocket 261. In this case, the timing chain 262 may be formed in a lengthwise direction of the guide member 221.

In one embodiment, the sprocket 261 may include a first sprocket 261a formed at one end of the timing chain 262, and a second sprocket 261b formed at another end of the timing chain 262. Particularly, the first sprocket 261a and the second sprocket 261b may prevent the timing chain 262 from leaving its path when the timing chain 262 rotates.

In one embodiment, the first sprocket 261a may receive a driving force and may rotate the timing chain 262. In this case, the second sprocket 261b may inactively rotate together with the timing chain 262.

The chain unit 260 may include a driving unit 264 connected to the sprocket 261 and configured to rotate the sprocket 261. In one embodiment, the driving unit 264 may be connected to the sprocket 261 via a rotation shaft 265. The driving unit 264, in one embodiment, may be connected to the first sprocket 261a via the rotation shaft 265.

In one embodiment, the driving unit 264 may be disposed at an external side of the first chamber 731. The driving unit 264 may be disposed on an external surface of the first chamber 731, and the rotation shaft 265 may be formed to pass through the first chamber 731 so as to be connected to the first sprocket 261a.

In one embodiment, the chain unit 260 may include a tension maintaining unit 263 formed in the timing chain 262 and configured to prevent or substantially prevent the timing chain 262 from being drooped due to its weight. The tension maintaining unit 263 may be formed in a plural number, such that tension maintaining units 263 of a plurality of tension maintaining units 263 are spaced apart from each other by a distance.

The tension maintaining units 263 may be arranged between the first sprocket 261a and the second sprocket 261b. Also, the tension maintaining units 263 may be formed as sprockets so as to maintain the tension of the timing chain 262.

The tension maintaining unit 263 may apply a force to a lower portion of the timing chain 262 so as to maintain the tension of the timing chain 262. In one embodiment, the tension maintaining unit 263 may contact a portion of the timing chain 262 which passes through the first sprocket 261a and is moved downward, so as to apply a force to the portion.

The tension maintaining unit 263 may include a plurality of tension maintaining sprockets (not shown). In particular, the number of tension maintaining sprockets may be three, in which two may be formed at an upper side, and one may be formed under the two tension maintaining sprockets, so as to contact the timing chain 262. Although a total of three tension maintaining sprockets are described above, the present invention is not limited thereto, and the total number of tension maintaining sprockets may be varied as long as the tension maintaining unit 263 maintains the tension of the timing chain 262.

The hook unit 240, in one embodiment, may include a hook housing 241 formed on the chuck transfer member 230. The hook housing 241 may be formed to be fixed onto the chuck transfer member 230. Also, the hook unit 240 may include a hook 242 combined with the hook housing 241 so as to allow the hook housing 241 to be linearly moved. The hook 242 may contact the chain unit 260 and thus be linearly moved in a height direction of the hook housing 241.

The hook unit 240, in one embodiment, may include an elastic part 243 formed in the hook housing 241 and on the hook 242. In this case, the elastic part 243 may be formed as tension spring so as to provide a restoration force in a direction opposite to a transferring direction of the hook 242 when the hook 242 is linearly moved. In particular, when the hook 242 is moved upward toward the hook housing 241, the elastic part 243 may provide a restoration force in a direction opposite to the transferring direction of the hook 242. Also, the elastic part 243 is not limited to a tension spring and may include any device or material for providing a restoration force to the hook 242.

The LM guide 220 may be disposed between the chuck transfer member 230 and the guide member 221. The LM guide 220 may include a pair of guide rails 223 disposed on a surface of the guide member 221, and a pair of guide blocks 225 disposed on a surface of the chuck transfer member 230. The guide blocks 225 are inserted into the guide rails 223, and may make a reciprocating movement along the guide rails 223.

A pair of LM rails may be used as the guide rails 223 and a pair of LM blocks may be used as the guide blocks 225, thereby forming an LM system. The LM system is a transfer system that offers a very high positioning accuracy since it has a low friction coefficient and hardly causes a positioning error to occur, compared to existing sliding guide systems. In the present specification, a detailed description of the LM system is not provided.

An operation of the chuck transfer member 230 that is moved along the guide member 221 will now be further described with reference to FIG. 5.

The chuck transfer member 230 is moved along the guide member 221 due to operation of the hook unit 240. Specifically, the chuck transfer member 230 may be moved due to operation of the driving unit 264.

In one embodiment, when the driving unit 264 operates, the driving unit 264 rotates the rotation shaft 265 and thus rotates the first sprocket 261a. In this case, the timing chain 262 combined with the first sprocket 261a rotates. When the timing chain 262 rotates, the hook 242 may be inserted into a space formed in the timing chain 262.

In one embodiment, if the timing chain 262 rotates and the hook 242 contacts a connection part of the timing chain 262, the hook 242 may be moved upward to the hook housing 241. In this case, the elastic part 243 may apply a force to the hook 242 toward the timing chain 262.

During the above process, when the timing chain 262 continuously rotates, the connection part of the timing chain 262 passes the hook 242, and the hook 242 is disposed in the space of the timing chain 262. The elastic part 243 may apply a force to the hook 242, such that the hook 242 may be inserted into the space of the timing chain 262.

When the hook 242 is inserted into the timing chain 262 as described above, as the timing chain 262 rotates, the hook 242 may be moved in a transferring direction of the timing chain 262. In this case, the chuck transfer member 230 connected to the hook 242 is moved together with the hook 242. In one embodiment, the chuck transfer member 230 is moved on external side surfaces of the guide member 221. In this case, the LM guide 220 may aid the chuck transfer member 230 to be linearly moved along the guide member 221.

In one embodiment, if the hook 242 is moved together with the timing chain 262 as described above, the chuck transfer member 230 may be moved in a direction (e.g., a direction opposite to the Y-axis direction). That is, the chuck transfer member 230 may be moved in a direction of an arrow of FIG. 5.

Accordingly, the chuck transfer member 230 may be linearly moved along the guide member 221 at a constant speed, and a ripple phenomenon of a deposition material due to a variable speed of the chuck transfer member 230 may be minimized or reduced. Also, an error rate of products may be minimized or reduced, and thus manufacturing and inspection costs of the products may be reduced.

Figure 8:
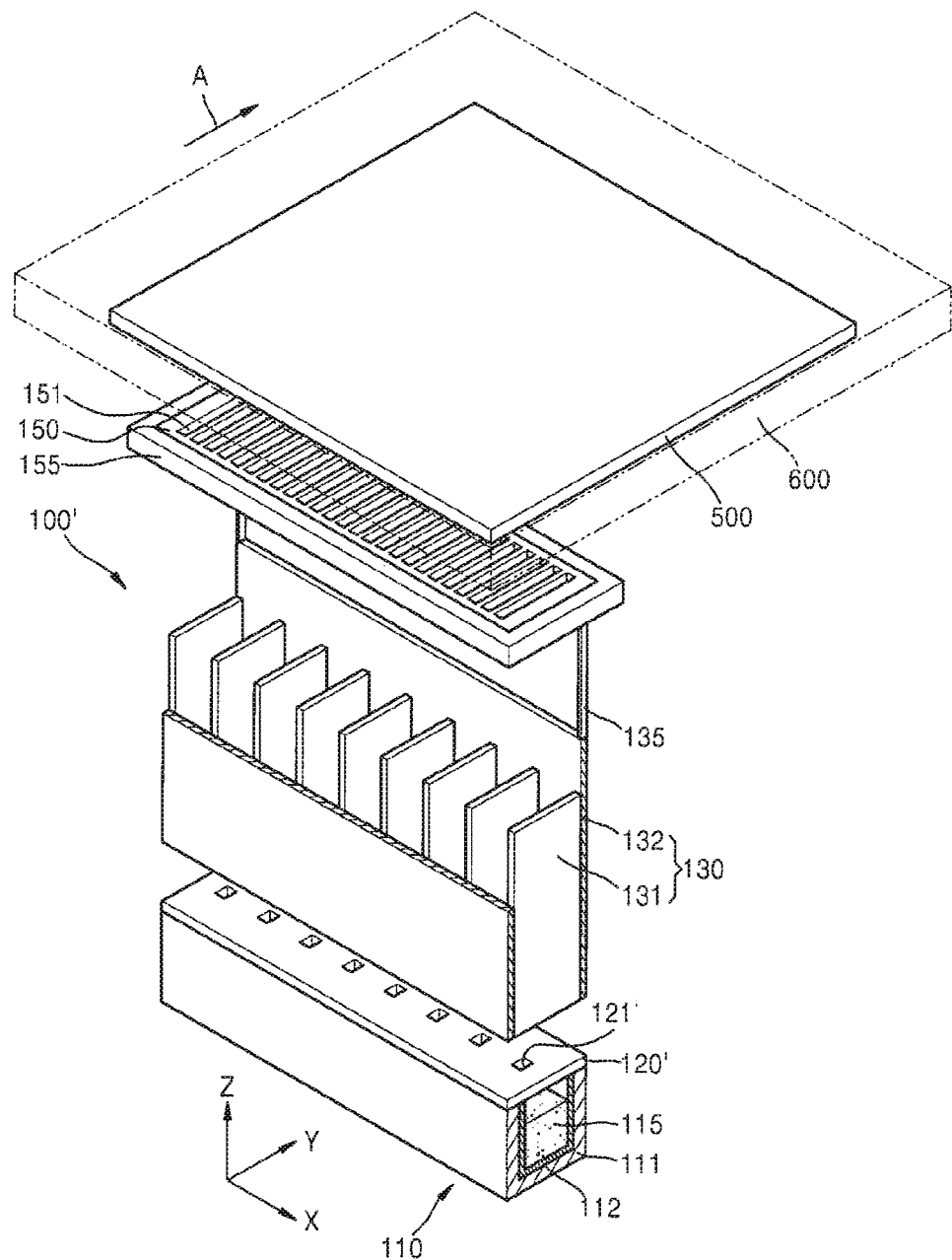
FIG. 8 is a perspective view of an organic layer deposition assembly of an organic layer deposition apparatus, according to an embodiment of the present invention.
Figure 9:
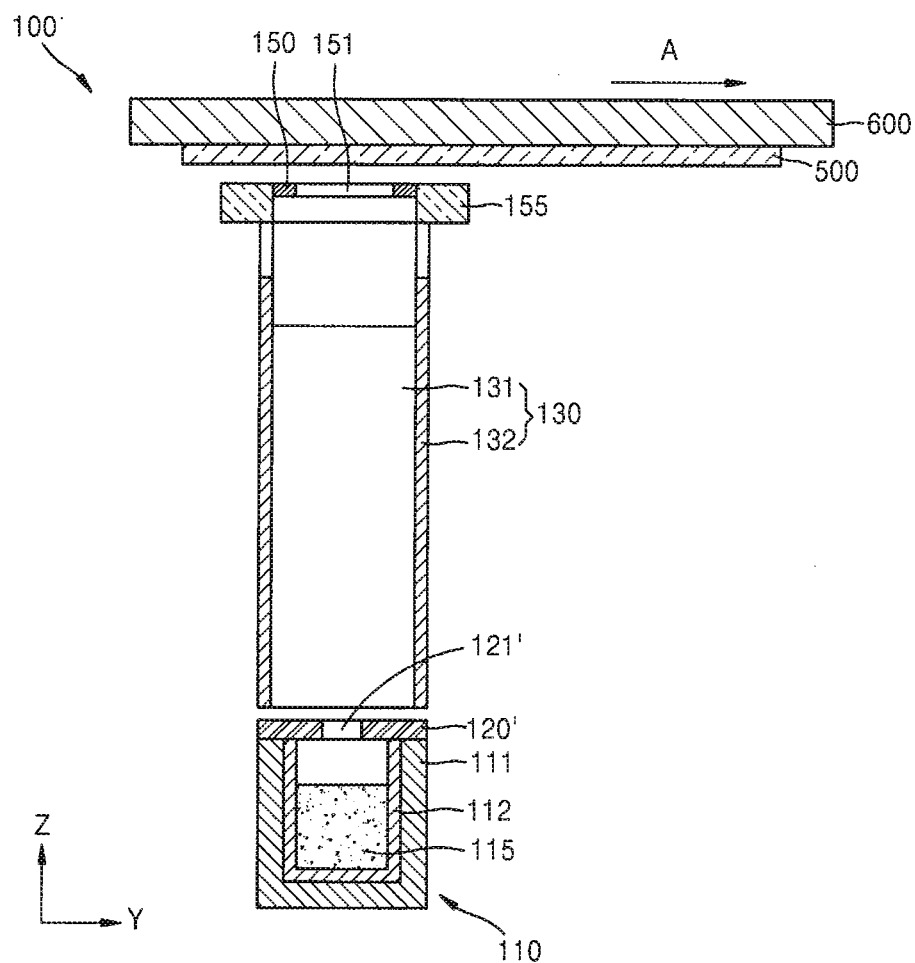
FIG. 9 is a side cross-sectional view of the organic layer deposition assembly of FIG. 8.
Figure 10:
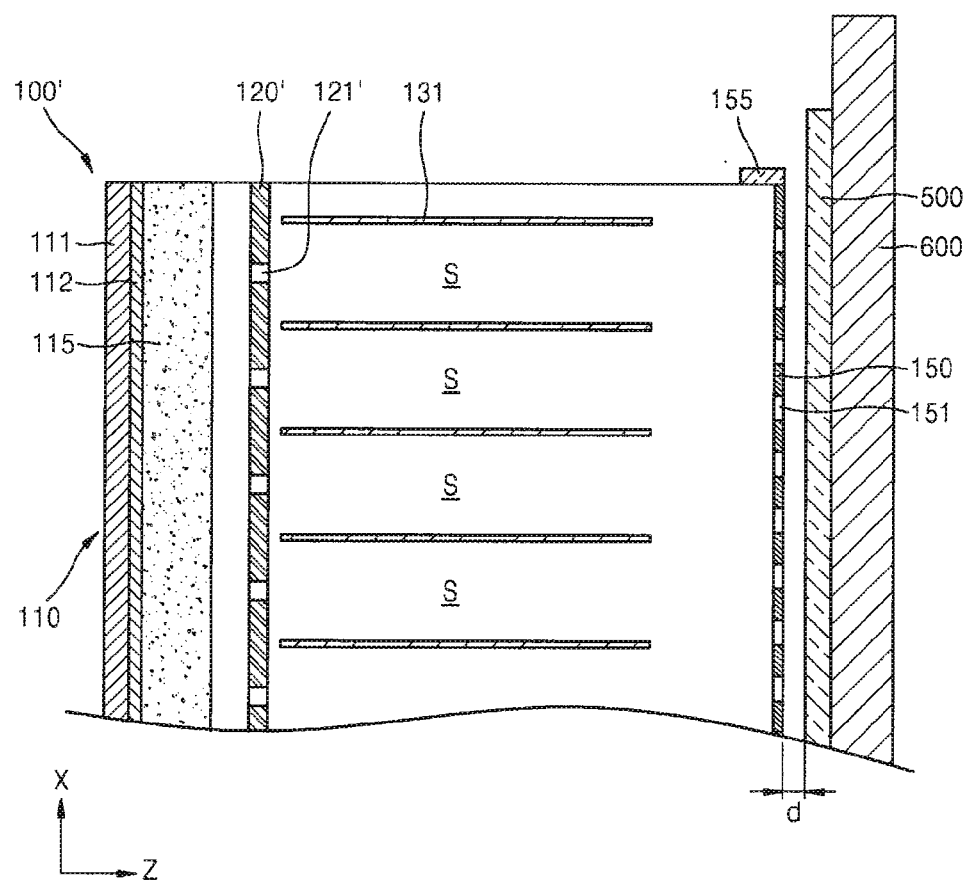
FIG. 10 is a front cross-sectional view of the organic layer deposition assembly of FIG. 8.

FIG. 8 is a perspective view of an organic layer deposition assembly of an organic layer deposition apparatus, according to an embodiment of the present invention. FIG. 9 is a side cross-sectional view of the organic layer deposition assembly of FIG. 8. FIG. 10 is a front cross-sectional view of the organic layer deposition assembly of FIG. 8.

Referring to FIGS. 8 to 10, an organic layer deposition assembly 100', according to an embodiment of the present invention, includes the deposition source 110, a deposition source nozzle unit 120', the barrier plate assembly 130, and the patterning slit sheet 150.

Although a chamber is not illustrated in FIGS. 8 to 10 for convenience of explanation, all the components of the organic layer deposition assembly 100' may be arranged in a chamber that is maintained in an appropriate vacuum state. This structure may be provided to achieve linearity of the deposition material 115.

In the chamber, the substrate 500 that is a deposition target substrate is transferred by the electrostatic chuck 600 of FIGS. 1 and 2, for example. The substrate 500 may be a substrate for flat panel displays. A large substrate, such as a mother glass, for manufacturing a plurality of flat panel displays, may be used as the substrate 500. However, the present invention is not limited thereto, and other substrates may also be used.

In one embodiment, the substrate 500 is moved with respect to the organic layer deposition assembly 100. For example, as illustrated in FIG. 8, the substrate 500 may be moved in a direction of an arrow A relative to the organic layer deposition assembly 100.

In a conventional deposition method using a fine metal mask (FMM), a size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

In the organic layer deposition assembly 100 according to an embodiment of the present invention, deposition may be performed while at least one of the organic layer deposition assembly 100 or the substrate 500 are moved with respect to the other. In one embodiment, deposition may be continuously performed while the substrate 500, which faces the organic layer deposition assembly 100, is moved in a direction (e.g., the Y-axis direction) relative to the organic layer deposition assembly 100. That is, deposition may be performed in a scanning manner while the substrate 500 is moved in a direction of the arrow A illustrated in FIG. 8. Although the substrate 500 is illustrated as being moved in the Y-axis direction in the chamber 731 in FIG. 1 when deposition is performed, the present invention is not limited thereto. For example, deposition may be performed while the organic layer deposition assembly 100 is moved in a direction (e.g., the Y-axis direction) and the substrate 500 is held in a fixed position.

Thus, in the organic layer deposition assembly 100, the patterning slit sheet 150 may be much smaller than an FMM used in a conventional deposition method. In one embodiment, in the organic layer deposition assembly 100, deposition is continuously performed, i.e. in a scanning manner while the substrate 500 is moved in a direction (e.g., the Y-axis direction). Thus, a length of the patterning slit sheet 150 in a direction (e.g., the Y-axis direction) may be much less than a length of the substrate 500, and a width of the patterning slit sheet 150 in another direction (e.g., the X-axis direction) and a width of the substrate 500 in another direction (e.g., the X-axis direction) are substantially equal to each other. However, even when the width of the patterning slit sheet 150 in the X-axis direction is less than the width of the substrate 500 in the X-axis direction, deposition may be performed on the entire substrate 500 in the scanning manner while at least one of the substrate 500 or the organic layer deposition assembly 100 is moved with respect to the other.

As described above, since the patterning slit sheet 150 may be formed to be much smaller than the FMM used in the conventional deposition method, it is relatively easy to manufacture the patterning slit sheet 150. In other words, using the patterning slit sheet 150, which is smaller than the FMM used in the conventional deposition method, is more convenient in processes, including etching and other subsequent processes, such as precise extension, welding, transferring, and washing processes, than the FMM used in a conventional deposition method. In addition, this facilitates manufacturing a relatively large display device.

In order to perform deposition while at least one of the organic layer deposition assembly 100 or the substrate 500 are moved with respect to each other as described above, the organic layer deposition assembly 100 and the substrate 500 may be spaced apart from each other by a distance. This is described below in more detail.

The deposition source 110 that contains and heats the deposition material 115 is disposed at a side opposite to a side at which the substrate 500 is disposed in the chamber.

The deposition source 110, in one embodiment, includes the crucible 111 that is filled with the deposition material 115, and the heater 112 that heats the crucible 111.

The deposition source 110, in one embodiment, is disposed at a side of the deposition source 110 facing the substrate 500. The deposition source nozzle unit 120' includes a plurality of deposition source nozzles 121' that may be arranged at intervals (e.g., equal intervals) in a direction (e.g., the X-axis direction). The deposition material 115 that is vaporized in the deposition source 110 passes through the deposition source nozzles 121' of the deposition source nozzle unit 120' toward the substrate 500 that is a deposition target substrate.

The barrier plate assembly 130 is disposed at a side of the deposition source nozzle unit 120'. The barrier plate assembly 130 includes a plurality of barrier plates 131, and a barrier plate frame 132 that covers sides of the barrier plates 131. The barrier plates 131, in one embodiment, may be arranged parallel to each other at intervals (e.g., equal intervals) in a direction (e.g., the X-axis direction). In one embodiment, each of the barrier plates 131 may be arranged parallel to a Y-Z plane in FIG. 8, and may have a rectangular shape. The barrier plates 131 arranged as described above partition a deposition space between the deposition source nozzle unit 120' and the patterning slit sheet 150 into a plurality of sub-deposition spaces S (see FIG. 10). In the organic layer deposition assembly 100', as illustrated in FIG. 10, the deposition space is divided by the barrier plates 131 into the sub-deposition spaces S that respectively correspond to the deposition source nozzles 121' through which the deposition material 115 is discharged.

In one embodiment, the barrier plates 131 may be respectively disposed between adjacent deposition source nozzles 121'. In other words, each of the deposition source nozzles 121' may be disposed between two adjacent barrier plates 131. In one embodiment, the deposition source nozzles 121' may be respectively located at a midpoint between two adjacent barrier plates 131. However, the present invention is not limited to this structure. For example, in another embodiment, a plurality of the deposition source nozzles 121' may be disposed between two adjacent barrier plates 131.

In one embodiment, since the barrier plates 131 partition the deposition space between the deposition source nozzle unit 120' and the patterning slit sheet 150 into the sub-deposition spaces S as described above, the deposition material 115 discharged through each of the deposition source nozzles 121' is not mixed with the deposition material 115 discharged through the other deposition source nozzles 121' and passes through a plurality of patterning slits 151 so as to be deposited on the substrate 500. In other words, the barrier plates 131 guide the deposition material 115, which is discharged through the deposition source nozzles 121', to move straight and not flow in a direction (e.g., the X-axis direction).

As described above, the deposition material 115 is forced to move straight by installing the barrier plates 131, such that a smaller shadow may be formed on the substrate 500 compared to a case in which no barrier plates are installed. Thus, the organic layer deposition assembly 100' and the substrate 500 can be spaced apart from each other by a distance. This will be described below in more detail.

The patterning slit sheet 150 and a frame 155 are disposed between the deposition source 110 and the substrate 500. The shape of the frame 155 may be similar to a window frame. The patterning slit sheet 150 is bound inside the frame 155. The patterning slit sheet 150 includes the patterning slits 151 arranged in a direction (e.g., the X-axis direction), and the patterning slits 151 may extend in another direction (e.g., the Y-axis direction). The deposition material 115 that has been vaporized in the deposition source 110 and passed through the deposition source nozzle 121' passes through the patterning slits 151 toward the substrate 500.

The patterning slit sheet 150 may be formed of a metal thin film, and may be fixed onto the frame 150 such that a tensile force is exerted thereon. The patterning slits 151, in one embodiment, may be formed by etching the patterning slit sheet 150 to a stripe pattern. The number of patterning slits 151 may be equal to the number of deposition patterns to be formed on the substrate 500, for example.

In one embodiment, the barrier plate assembly 130 and the patterning slit sheet 150 may be formed spaced apart from each other by a distance. Alternatively, the barrier plate assembly 130 and the patterning slit sheet 150 may be connected by a connection member 135.

As described above, the organic layer deposition assembly 100' according to one embodiment performs deposition while the substrate 500 is moved with respect to the organic layer deposition assembly 100'. In order to move the substrate 500 relative to the organic layer deposition assembly 100', the patterning slit sheet 150 is spaced apart from the substrate 500 by a certain distance. In addition, in order to prevent or substantially prevent formation of a relatively large shadow on the substrate 500 when the patterning slit sheet 150 and the substrate 500 are disposed apart from each other, the barrier plates 131 are arranged between the deposition source nozzle unit 120' and the patterning slit sheet 150 to achieve linearity of the deposition material 115. Thus, the size of the shadow that may be formed on the substrate 500 may be significantly reduced.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM, such as scratches on patterns formed on the substrate, may occur. In addition, since it is difficult to move the mask with respect to the substrate, the mask and the substrate need to be formed having the same size. Accordingly, the mask needs to be large as the size of a display device increases. However, it is difficult to form a large mask.

In the organic layer deposition assembly 100' according to an embodiment of the present invention, the patterning slit sheet 150 is formed spaced apart from the substrate 500 by a distance d (see FIG. 10). The barrier plates 131 may be installed to reduce a size of a shadow formed on the substrate 500.

According to embodiments of the present invention, deposition may be performed while a mask formed smaller than a substrate is moved with respect to the substrate, and thus, it is easy to manufacture the mask. In addition, defects due to contact between the substrate and the mask may be prevented or substantially prevented. Furthermore, since it is unnecessary to closely contact the substrate with the mask during a deposition process, a manufacturing speed may be improved.

In one embodiment, the deposition source 110, the deposition source nozzle unit 120', and the patterning slit sheet 150 included in the organic layer deposition assembly 100' are not integrally formed but are separately included in the deposition unit 730 of FIG. 1. Accordingly, the deposition source 110 may be easily attached to and detached from the organic layer deposition assembly 100', such as to fill the deposition source 110 with the deposition material 115, to cleanse the patterning slit sheet 150, or to exchange the patterning slit sheet 150 with another patterning slit sheet.

Figure 11:
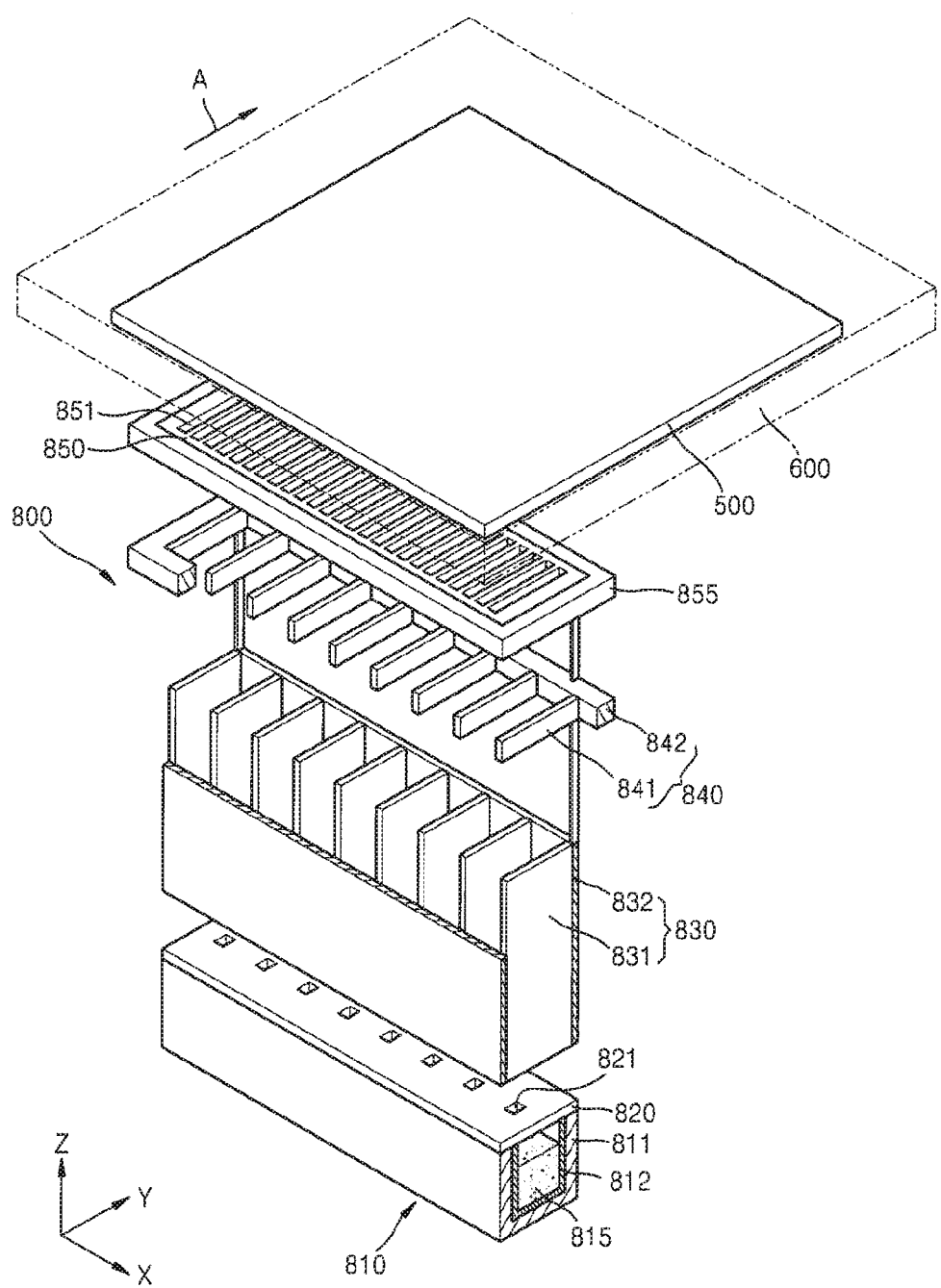
FIG. 11 is a perspective view of an organic layer deposition assembly of an organic layer deposition apparatus, according to another embodiment of the present invention.

FIG. 11 is a perspective view of an organic layer deposition assembly of an organic layer deposition apparatus, according to another embodiment of the present invention.

Referring to FIG. 11, an organic layer deposition assembly 800 according to another embodiment of the present invention includes a deposition source 810, a deposition source nozzle unit 820, a first barrier plate assembly 830, a second barrier plate assembly 840, and a patterning slit sheet 850.

The deposition source 810 includes a crucible 811 that is filled with a deposition material 815, and a heater 812 that heats the crucible 811 to vaporize the deposition material 815, which is contained in the crucible 811, toward the deposition source nozzle unit 820. The deposition source nozzle unit 820 is disposed at a side of the deposition source 810. The deposition source nozzle unit 820 includes a plurality of deposition source nozzles 821 arranged in a direction (e.g., the X-axis direction). The patterning slit sheet 850 and a frame 855 are further disposed between the deposition source 810 and the substrate 500. The patterning slit sheet 850 includes a plurality of patterning slits 851 that are arranged in a direction (e.g., the X-axis direction). The barrier plate assembly 830 is disposed at a side of the deposition source nozzle unit 820 and includes a plurality of barrier plates 831, and a barrier plate frame 832 that covers sides of the barrier plates 831. The deposition source assembly 810, the first barrier plate assembly 830, and the patterning slit sheet 850 may have the same or substantially the same structures as those of the organic layer deposition assembly 100' described above with reference to FIGS. 8 to 10, and, thus, further description thereof will not be repeated here.

The organic layer deposition assembly 800 differs from the organic layer deposition assembly 100' in that the second barrier plate assembly 840 is disposed at a side of the first barrier plate assembly 830. In one embodiment, the second barrier plate assembly 840 includes a plurality of second barrier plates 841, and a second barrier plate frame 842 that covers sides of the second barrier plates 841. In one embodiment, the second barrier plates 841 may be arranged parallel to each other at equal intervals in a direction (e.g., the X-axis direction). In addition, each of the second barrier plates 841 may be formed to extend in a plane (e.g., the Y-Z plane in FIG. 11, i.e. perpendicular to the X-axis direction).

The first barrier plates 831 and the second barrier plates 841 arranged as described above partition a deposition space between the deposition source nozzle unit 820 and the patterning slit sheet 850. The deposition space is divided by the first barrier plates 831 and the second barrier plates 841 into sub-deposition spaces that respectively correspond to the deposition source nozzles 821 through which the deposition material 815 is discharged.

In one embodiment, the second barrier plates 841 are disposed to respectively correspond to the first barrier plates 831. In other words, the second barrier plates 841 may be aligned with respect to the first barrier plates 831, respectively. That is, each pair of the corresponding first and second barrier plates 831 and 841 may be located on a same plane. Although the first barrier plates 831 and the second barrier plates 841 are respectively illustrated as having a same thickness in the X-axis direction, aspects of the present invention are not limited thereto. That is, in one embodiment, the second barrier plates 841, which are precisely aligned with the patterning slits 851, may be formed to be relatively thin, whereas the first barrier plates 831, which may not be precisely aligned with the patterning slits 851, may be formed to be relatively thick. This may increase ease of manufacturing the organic layer deposition assembly 800.

Figure 12:
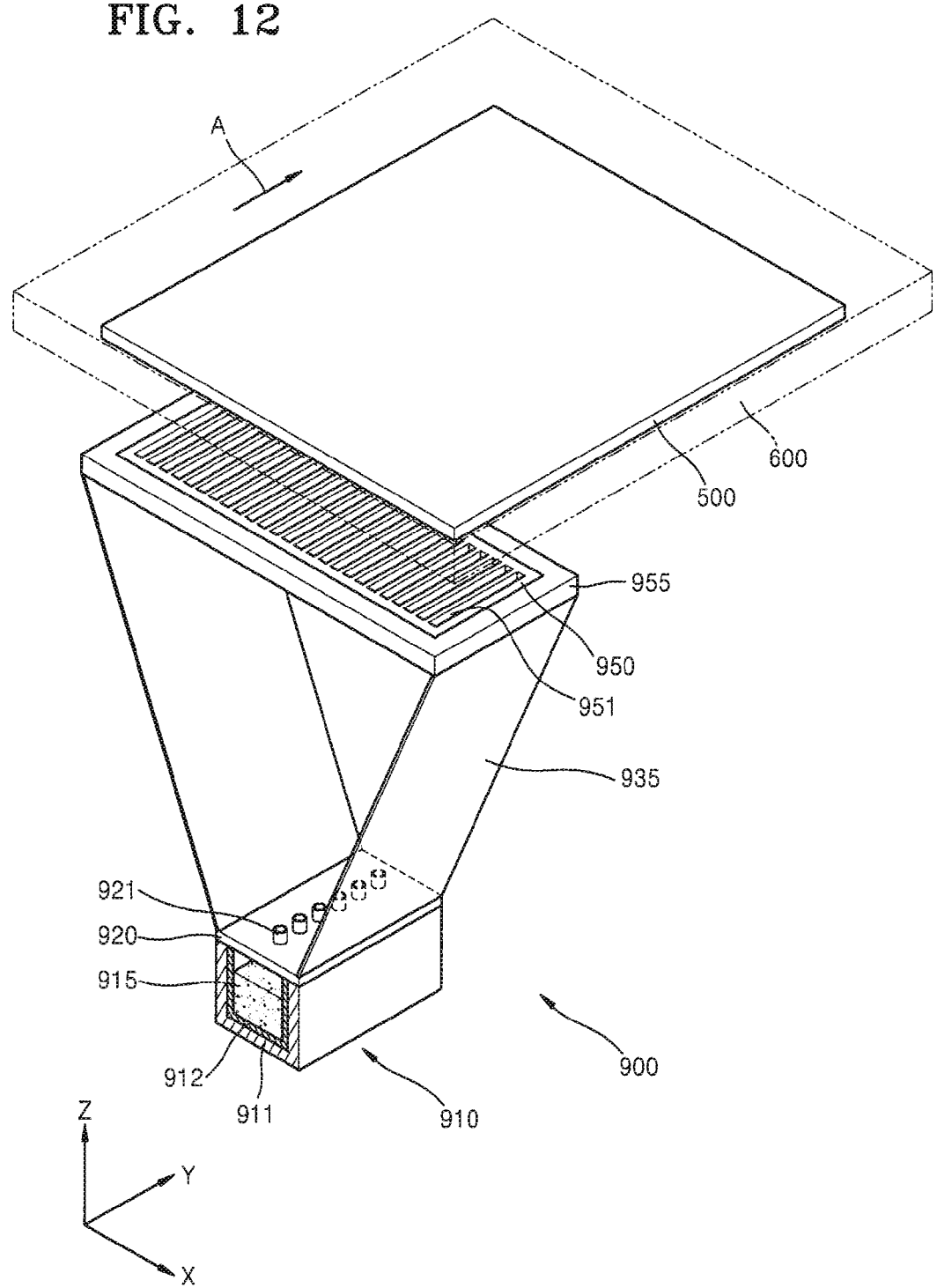
FIG. 12 is a perspective view of an organic layer deposition assembly of an organic layer deposition apparatus, according to another embodiment of the present invention.

FIG. 12 is a perspective view of an organic layer deposition assembly of an organic layer deposition apparatus, according to another embodiment of the present invention.

Referring to FIG. 12, an organic layer deposition assembly 900 according to another embodiment of the present invention includes a deposition source 910, a deposition source nozzle unit 920, and a patterning slit sheet 950.

The deposition source 910 includes a crucible 911 that is filled with a deposition material 915, and a heater 912 that heats the crucible 911 to vaporize the deposition material 915, which is contained in the crucible 911, toward the deposition source nozzle unit 920. The deposition source nozzle unit 920 is disposed at a side of the deposition source 910. The deposition source nozzle unit 920 includes a plurality of deposition source nozzles 921 arranged in a direction (e.g., the Y-axis direction). The patterning slit sheet 950 and a frame 955 are further disposed between the deposition source 910 and the substrate 500. The patterning slit sheet 950 includes a plurality of patterning slits 951 that are arranged in a direction (e.g., the X-axis direction). In addition, the deposition source 910 and the deposition source nozzle unit 920 may be connected to the patterning slit sheet 950 by a connection member 935.

The organic layer deposition assembly 900 differs from the embodiments described above in terms of the arrangement of the deposition source nozzles 921 included in the deposition source nozzle unit 920. This is described in further detail below.

The deposition source nozzle unit 920 is disposed at a side of the deposition source 910 and, in particular, at the side of the deposition source 910 facing the substrate 500. The deposition source nozzle unit 920 includes the deposition source nozzles 921 that may be arranged at intervals (e.g., equal intervals) in the Y-axis direction, i.e. a scanning direction of the substrate 500. The deposition material 915 that is vaporized in the deposition source 910 passes through the deposition source nozzle unit 920 toward the substrate 500 that is a deposition target substrate. As described above, when the deposition source nozzle unit 920 includes the deposition source nozzles 921 arranged in the Y-axis direction, that is, the scanning direction of the substrate 500, the size of a pattern formed of the deposition material 915 discharged through each of the plurality of patterning slits 951 of the patterning slit sheet 950 is affected by the size of one of the deposition source nozzles 921 since, in one embodiment, there is only one line of the deposition source nozzles 921 in the X-axis direction. Thus, no shadow may be formed on the substrate 500. In addition, since the deposition source nozzles 921 are arranged in the scanning direction of the substrate 500, even though there may be a difference in flux between the deposition source nozzles 921, the difference may be compensated for and deposition uniformity may be maintained constant or substantially constant. The organic layer deposition assembly 900, in one embodiment, does not include a barrier plate assembly, such as that shown in FIG. 8, thereby improving utility efficiency of the deposition material 915.

Figure 13:
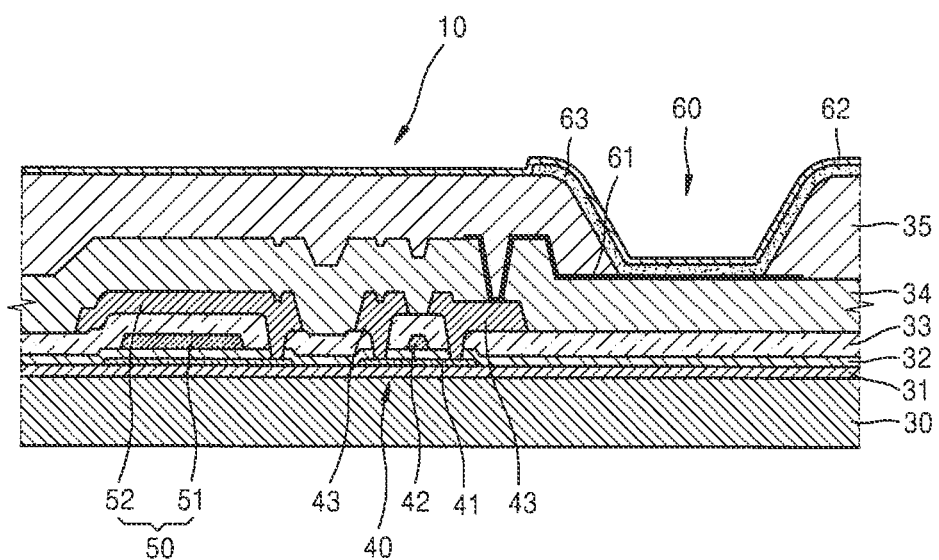
FIG. 13 is a cross-sectional view of an organic light-emitting display device manufactured using an organic layer deposition apparatus, according to an embodiment of the present invention.

FIG. 13 is a cross-sectional view of an organic light-emitting display device manufactured using an organic layer deposition apparatus, according to an embodiment of the present invention.

Referring to FIG. 13, an organic light-emitting display device 10 (e.g., an active matrix-type organic light-emitting display device) is formed on a substrate 30. The substrate 30 may be the substrate 500 described above and may be formed of a transparent material, such as glass, plastic, or metal. An insulating layer 31, such as a buffer layer, may be formed on an entire surface of the substrate 30.

In one embodiment, a thin film transistor (TFT) 40, a capacitor 50, and an organic light-emitting diode (OLED) 60 are formed on the insulating layer 31, as illustrated in FIG. 13.

A semiconductor active layer 41 may be formed on an upper surface of the insulating layer 31 in a set or predetermined pattern. A gate insulating layer 32 may be formed to cover the semiconductor active layer 41. The semiconductor active layer 41 may include a p-type or n-type semiconductor material.

In one embodiment, a gate electrode 42 of the TFT 40 is formed in a region of the gate insulating layer 32 corresponding to the semiconductor active layer 41. An interlayer insulating layer 33 may be formed to cover the gate electrode 42. The interlayer insulating layer 33 and the gate insulating layer 32 may be etched, such as by dry etching, to form a contact hole exposing parts of the semiconductor active layer 41.

In one embodiment, source/drain electrodes 43 are formed on the interlayer insulating layer 33 to contact the semiconductor active layer 41 through the contact hole. In one embodiment, a passivation layer 34 is formed to cover the source/drain electrodes 43, and is etched to expose a part of one of the source/drain electrodes 43. An insulating layer (not shown) may be further formed on the passivation layer 34 so as to planarize the passivation layer 34.

The OLED 60 may display set or predetermined image information by emitting red, green, or blue light according to current. The OLED 60 includes a first electrode 61 disposed on the passivation layer 34. The first electrode 61 is electrically connected to the exposed source/drain electrode 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes a surface of a region of the substrate 30 in which the first electrode 61 is formed, and, in particular, a surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), and/or an electron injection layer (EIL). Non-limiting examples of available organic materials include copper phthalocyanine (CuPc), N,N'-di(naphthalene-1-yl)-N,N"-diphenyl-benzidine (NPB), and tris-8-hydroxyquinoline aluminum (Alq$_3$).

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide (In2O3). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or In$_2$O$_3$ on the reflective layer. The first electrode 61 may be formed by forming a layer, such as by sputtering, for example, and then patterning the layer, such as by photolithography, for example.

The second electrode 62 may also be formed as a transparent electrode or a reflective electrode. In one embodiment, the second electrode 62 is formed as a transparent electrode and is used as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, In$_2$O$_3$, or the like. In one embodiment, when the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

The organic layer deposition apparatuses according to the embodiments of the present invention described above may be applied to form an organic layer or an inorganic layer of an organic TFT, and to form layers from various materials.

Figure 14:
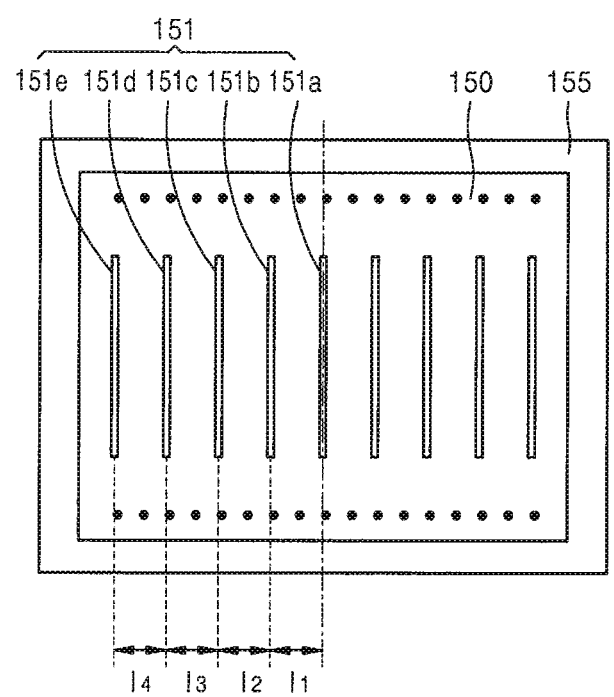
FIG. 14 is a schematic plan view illustrating a structure in which patterning slits are arranged at equal intervals in a patterning slit sheet of the organic layer deposition apparatus, according to an embodiment of the present invention.

FIG. 14 is a schematic plan view illustrating a structure in which the patterning slits 151 are arranged at equal intervals in the patterning slit sheet 150 of the organic layer deposition apparatus, according to an embodiment of the present invention. FIG. 15 is a schematic cross-sectional view illustrating organic layers formed on the substrate 500 by using the patterning slit sheet 150 of FIG. 14, according to an embodiment of the present invention.

FIGS. 14 and 15 illustrate the patterning slit sheet 150, according to an embodiment of the present invention, in which the patterning slits 151 are arranged at equal intervals. That is, in one embodiment, an arrangement of the patterning slits 151 satisfies the following condition: $I_1=I_2=I_3=I_4$.

As shown in FIG. 15, in one embodiment, an incident angle of a deposition material discharged along a centerline C of a deposition space DS is substantially perpendicular to the substrate 500. Thus, an organic layer $P_1$ formed using the deposition material that has passed through a patterning slit 151a has a minimal size of a shadow, and a right-side shadow $SR_1$ and a left-side shadow $SL_1$ are formed symmetrical or substantially symmetrical to each other.

However, an incident angle of the deposition material that passes through patterning slits disposed farther from the centerline C of the deposition space DS gradually increases as a distance from the centerline C increases, and, in one embodiment, an incident angle $\theta_e$ of the deposition material that passes through an outermost patterning slit 151e is approximately 55°. Accordingly, the deposition material is incident at an inclination with respect to the patterning slit 151e, and an organic layer $P_5$ formed using the deposition material that has passed through the patterning slit 151e has the largest shadow. In particular, a left-side shadow $SR_5$ is larger than a right-side shadow $SR_5$.

That is, as the incident angle of the deposition material increases, the size of the shadow also increases. In particular, the size of the shadow at positions farther from the centerline C of the deposition space DS increases. In addition, the incident angle of the deposition material increases as a distance between the centerline C of the deposition space DS and the respective patterning slits increases. Thus, organic layers formed using the deposition material that passes through the patterning slits disposed farther from the centerline C of the deposition space DS have a larger shadow size. In particular, of the shadows on both sides of the respective organic layers, the size of the shadow at a side farther from the centerline C of the deposition space DS is larger than that of the side nearer to the centerline C.

That is, referring to FIG. 15, the organic layers formed on the left side of the centerline C of the deposition space DS have a structure in which a left hypotenuse is longer than a right hypotenuse, and the organic layers formed on the right side of the centerline C of the deposition space DS have a structure in which a right hypotenuse is longer than a left hypotenuse.

Also, in the organic layers formed on the left side of the centerline C of the deposition space DS, the lengths of the left hypotenuses increases toward the left. In the organic layers formed on the right side of the centerline C of the deposition space DS, the lengths of the right hypotenuses increases toward the right. Consequently, the organic layers formed in the deposition space DS may be formed symmetrical or substantially symmetrical to each other about the centerline C of the deposition space DS.

This structure will now be described in more detail.

The deposition material that passes through a patterning slit 151b passes through the patterning slit 151b at an incident angle $\theta_b$, and an organic layer $P_2$ formed using the deposition material that has passed through the patterning slit 151b has a left-side shadow having a size $SL_2$. Similarly, the deposition material that passes through a patterning slit 151c passes through the patterning slit 151c at an incident angle $\theta_c$, and an organic layer $P_3$ formed using the deposition material that has passed through the patterning slit 151c has a left-side shadow having a size $SL_3$. Similarly, the deposition material that passes through a patterning slit 151d passes through the patterning slit 151d at an incident angle $\theta_d$, and an organic layer $P_4$ formed using the deposition material that has passed through the patterning slit 151d has a left-side shadow having a size $SL_4$. Similarly, the deposition material that passes through the patterning slit 151e passes through the patterning slit 151e at the incident angle $\theta_e$, and an organic layer $P_5$ formed using the deposition material that has passed through the patterning slit 151e has a left-side shadow having a size $SL_5$.

In this regard, the incident angles satisfy the following condition: $\theta_b < \theta_c < \theta_d < \theta_e$, and, thus, the sizes of the shadows of the organic layers also satisfy the following condition: $SL_1 < SL_2 < SL_3 < SL_4 < SL_5$.

As described above, the organic layer deposition apparatus according to embodiments of the present invention is easily manufactured and is suitable for use in the mass production of a large substrate. The organic layer deposition apparatus has improved precision of transferring a substrate, manufacturing yield, and deposition efficiency.

While the present invention has been particularly shown and described with reference to some exemplary embodiments thereof, it will be understood by those of ordinary skill in the art that various changes in form and details may be made therein without departing from the spirit and scope of the present invention as defined by the following claims and equivalents thereof.

What is claimed is:

1. A method of manufacturing an organic light-emitting display device, the method comprising:
   fixing a substrate onto an electrostatic chuck;
   combining the electrostatic chuck with a chuck moving member;
   moving the electrostatic chuck along a guide member into a chamber by using the chuck moving member; and
   depositing an organic layer on the substrate while moving the substrate with respect to an organic layer deposition assembly arranged in the chamber,
   wherein the chuck moving member is moved along the guide member by an association of a chain, unit and a hook unit, and
   wherein the substrate is spaced apart from the organic layer deposition assembly.

2. The method of claim 1,
   wherein the chuck moving member comprises the hook unit having a variable height, and
   wherein the guide member comprises the chain unit corresponding to the hook unit.

3. The method of claim 2, wherein the chain unit comprises:
   a sprocket rotatably arranged on the guide member; and
   a timing chain configured to surround an external surface of the sprocket.

4. The method of claim 3, wherein the timing chain is arranged in a lengthwise direction of the guide member.

5. The method of claim 3, wherein the chain unit further comprises a driving unit connected to and configured to rotate the sprocket.

6. The method of claim 5,
   wherein, the organic layer deposition assembly, the electrostatic chuck, the chuck moving member, and the guide member are arranged in the chamber, and
   wherein the driving unit is outside the chamber and connected to the sprocket via a shaft.

7. The method of claim 2, wherein the hook unit comprises:
   a hook housing, on the chuck moving member;
   a hook combined with the hook housing to allow the hook housing to be linearly moved; and
   an elastic part combined with the hook housing and the hook.

8. The method of claim 7, wherein the hook is contactable with the chain unit to be linearly moved in a height direction of the hook housing.

9. The method of claim 1, wherein the moving of the electrostatic chuck comprises:
   generating a driving force to rotate a shaft by using a driving unit;
   rotating a timing chain as a sprocket rotates due to the rotation of the shaft; and inserting a hook into the timing chain due to the rotation of the timing chain to move the chuck moving member along the guide member.

\* \* \* \* \*